United States Patent
Park et al.

(10) Patent No.: US 8,761,553 B2
(45) Date of Patent: Jun. 24, 2014

(54) OPTICAL NETWORK STRUCTURES FOR MULTI-CORE CENTRAL PROCESSOR UNIT

(75) Inventors: Sahnggi Park, Daejeon (KR); Gyungock Kim, Daejeon (KR); In Gyoo Kim, Daejeon (KR); Jeong Woo Park, Daejeon (KR); Sang Hoon Kim, Seoul (KR); Do Won Kim, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 269 days.

(21) Appl. No.: 13/302,371

(22) Filed: Nov. 22, 2011

(65) Prior Publication Data

US 2012/0148244 A1   Jun. 14, 2012

(30) Foreign Application Priority Data

Dec. 13, 2010   (KR) .................. 10-2010-0127118

(51) Int. Cl.
  *G02B 6/26*   (2006.01)
  *G02B 6/12*   (2006.01)

(52) U.S. Cl.
  USPC .................................. 385/14; 385/24; 385/50

(58) Field of Classification Search
  None
  See application file for complete search history.

(56) References Cited

U.S. PATENT DOCUMENTS

| | | | | |
|---|---|---|---|---|
| 5,054,873 A | * | 10/1991 | Davis et al. | 385/27 |
| 5,058,101 A | * | 10/1991 | Albanese et al. | 398/73 |
| 2005/0276604 A1 | * | 12/2005 | Morrow et al. | 398/73 |
| 2008/0104366 A1 | * | 5/2008 | Ohmori | 712/10 |
| 2009/0103345 A1 | * | 4/2009 | McLaren et al. | 365/64 |
| 2009/0103854 A1 | * | 4/2009 | Beausoleil et al. | 385/14 |
| 2010/0221008 A1 | | 9/2010 | Lee et al. | |
| 2010/0226657 A1 | * | 9/2010 | Raymond et al. | 398/141 |
| 2010/0266276 A1 | * | 10/2010 | Zheng et al. | 398/43 |

OTHER PUBLICATIONS

Keren Bergman, "Physical Layer Design of Nanoscale Silicon Photonic Interconnection Networks", Proc. of SPIE, 2009, pp. 72200U-1~72200U-5, vol. 7220, SPIE.

* cited by examiner

*Primary Examiner* — Mike Stahl

(57) ABSTRACT

Provided is an optical network structure. To configure an optical network structure between hundreds or more of cores in a CPU, intersection between waveguides does not occur, and thus, the optical network structure enables two-way communication between all the cores without an optical switch disposed in an intersection point. The present invention enables a single chip optical network using a silicon photonics optical element, and a CPU chip configured with hundreds or thousands of cores can be developed.

20 Claims, 7 Drawing Sheets

OPTICAL NETWORK STRUCTURES FOR MULTI-CORE CENTRAL PROCESSOR UNIT

CROSS-REFERENCE TO RELATED APPLICATIONS

This U.S. non-provisional patent application claims priority under 35 U.S.C. §119 of Korean Patent Application No. 10-2010-0127118, filed on Dec. 13, 2010, the entire contents of which are hereby incorporated by reference.

BACKGROUND OF THE INVENTION

The present invention disclosed herein relates to a silicon photonics device, and more particularly, to an optical network structure for transmitting an optical signal between cores of a Central Processing Unit (CPU) configured with a plurality of cores.

With the miniaturizing and speeding up trend of electronic devices, research is continuously being done for increasing the degree of integration of elements configuring each electronic device. To miniaturize and speed up electronic devices, it is required to miniaturize elements and quickly transmit a signal between the elements.

As one means for quickly transmitting a signal between elements of each electric device, an attempt is being made for applying an optical communication technology to the electronic devices. In applying the optical communication technology to electronic devices, a signal is transmitted at a higher speed, and moreover, high resistance, high heat and parasitic capacitance corresponding to limitations of the existing signal transmission scheme are moderated.

As optical elements necessary for realizing a multi-core CPU using optical communication that is one of the objectives of research on silicon photonics, there are an optical switch, an optical modulator, and a multiplexing/de-multiplexing optical filter as well as a light source and an optical detector. Among such elements, research has considerably been conducted on the light source, the optical detector and the optical modulator, and is approaching a level where characteristics thereof may be applied to optical integrated chips. However, the optical switch and multiplexing/de-multiplexing optical filter based on silicon have limitations that should be solved technically. Particularly, the optical switch is one of most vulnerable elements.

SUMMARY OF THE INVENTION

The present invention provides an optical network structure for transmitting an optical signal between cores of a CPU chip.

Embodiments of the present invention provide an optical network structure including: a waveguide having a ring type; a plurality of cores; a plurality of ring oscillator wavelength division multiplexing filters respectively corresponding to the cores, transmitting an optical signal of a channel corresponding to the cores to the waveguide, and transmitting the optical signal inputted to the waveguide to a core including a corresponding channel; and at least one control unit receiving the optical signal transmitted to the waveguide, modulating a channel of the received optical signal into a channel corresponding to a core for transmission, and transmitting an optical signal of the modulated channel to the waveguide.

In some embodiments, the waveguide, the cores and the ring oscillator wavelength division multiplexing filters may be implemented in a monolithic structure.

In other embodiments, each of the cores may include a transmission channel for using a corresponding ring oscillator wavelength division multiplexing filter, and at least one of the cores may include a dummy channel.

In still other embodiments, the transmission channel may include: a first ring oscillator wavelength division multiplexing filter receiving an optical signal from a light source; and an optical modulator modulating the optical signal, transmitted from the first ring oscillator wavelength division multiplexing filter, into an optical signal having a predetermined level and order.

In even other embodiments, the light source may be a broadband light source.

In yet other embodiments, the optical modulator may have a ring oscillator type.

In further embodiments, the transmission channel may further include a grating coupler outward extracting a predetermined optical signal for checking an optical signal state between the optical modulator and the ring oscillator wavelength division multiplexing filter.

In still further embodiments, the transmission channel may further include an optical detector receiving the optical signal of the waveguide, outputted from the control unit, through the ring oscillator wavelength division multiplexing filter.

In even further embodiments, the waveguide may include: at least one grating coupler for monitoring; and at least one amplifier amplifying an optical signal.

In yet further embodiments, the number of transmission channels may be twelve, and the number of dummy channels may be four.

In much further embodiments, the at least one control unit may include: a receiver receiving the optical signal from the waveguide; and a transmitter modulating the channel of the received optical signal into the channel corresponding to the core for transmission, and transmitting the optical signal of the modulated channel to the waveguide.

In still much further embodiments, the receiver may include a plurality of optical detectors receiving optical signals of sixteen channels from the waveguide, respectively.

In even much further embodiments, the transmitter may include a plurality of transmission channels outputting an optical signal, inputted from the light source, to the waveguide by using a ring oscillator wavelength division multiplexing filter.

In yet much further embodiments, the waveguide may be disconnected between the receiver and the transmitter.

In yet much further embodiments, each of the cores may include at least three transmission channels.

In yet much further embodiments, each of the transmission channels may modulate an optical signal using one device which is implemented by integrating an electronic-absorption optical modulator and a semiconductor optical amplifier in a monolithic structure.

In yet much further embodiments, an optical interconnection rate of the ring oscillator wavelength division multiplexing filters may be about 20%, an optical signal of an overlapped wavelength channel may be transmitted and received by a corresponding core, an optical signal corresponding to each core may be used, and other optical signals may be ignored.

In other embodiments of the present invention, an optical network structure includes: an upper waveguide having a ring type; a plurality of network units; a plurality of upper ring oscillator wavelength division multiplexing filters respectively corresponding to the network units, transmitting an optical signal of an upper channel corresponding to the network units to the upper waveguide, and transmitting the optical signal inputted to the upper waveguide to a network unit including a corresponding upper channel; and at least one control unit receiving the optical signal transmitted to the upper waveguide, modulating an upper channel of the received optical signal into an upper channel corresponding to a network unit for transmission, and transmitting an optical signal of the modulated upper channel to the upper waveguide, wherein each of the network units includes: a waveguide having a ring type; a plurality of cores; a plurality of ring oscillator wavelength division multiplexing filters respectively corresponding to the cores, transmitting an optical signal of a channel corresponding to the cores to the waveguide, and transmitting the optical signal inputted to the waveguide to a core including a corresponding channel; and a control unit receiving the optical signal transmitted to the waveguide, modulating a channel of the received optical signal into a channel corresponding to a core for transmission, and transmitting an optical signal of the modulated channel to the waveguide.

In some embodiments, a next-upper network may be configured with some of the network units.

In other embodiments, an upper network may be configured with a predetermined number of next-upper networks.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

A light source, an optical detector, an optical modulator, and an optical router may be used as optical elements necessary for configuring an optical network between cores of a CPU chip. The present invention proposes an inter-core optical network structure that is based on the operation characteristics of essential optical elements, most efficient, and realizable.

Figure 1:
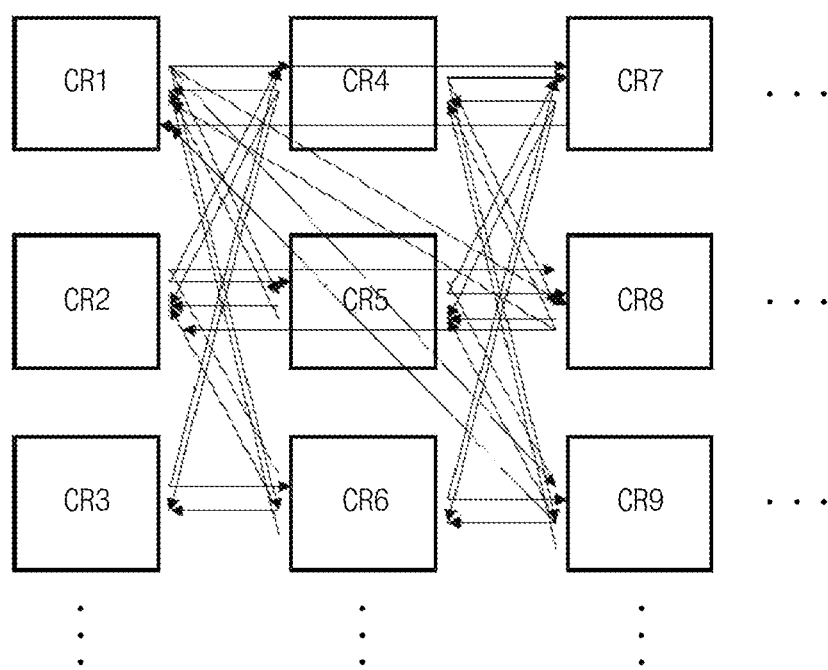
FIG. 1 is a diagram conceptually illustrating a complicated connection structure which is required for two-way communication between cores in a multi-core CPU.

FIG. 1 is a diagram conceptually illustrating a complicated connection structure which is required to enable two-way communication between cores in a multi-core CPU.

Referring to FIG. 1, each arrow line indicates a waveguide that is formed in a silicon layer of a Silicon On Insulation (SOI) wafer. All waveguides are disposed in the same layer, and thus, an optical switch is required to be provided to each intersection point. As the number of cores increases, a network structure becomes progressively complicated, and the number of optical switches increases geometrically.

A typical optical network structure uses an optical switch of a ring oscillator structure and an optical router. However, the characteristic of the ring oscillator that has experimentally been measured falls far short of the minimum requirement condition of that is required in an optical network.

Figure 2:
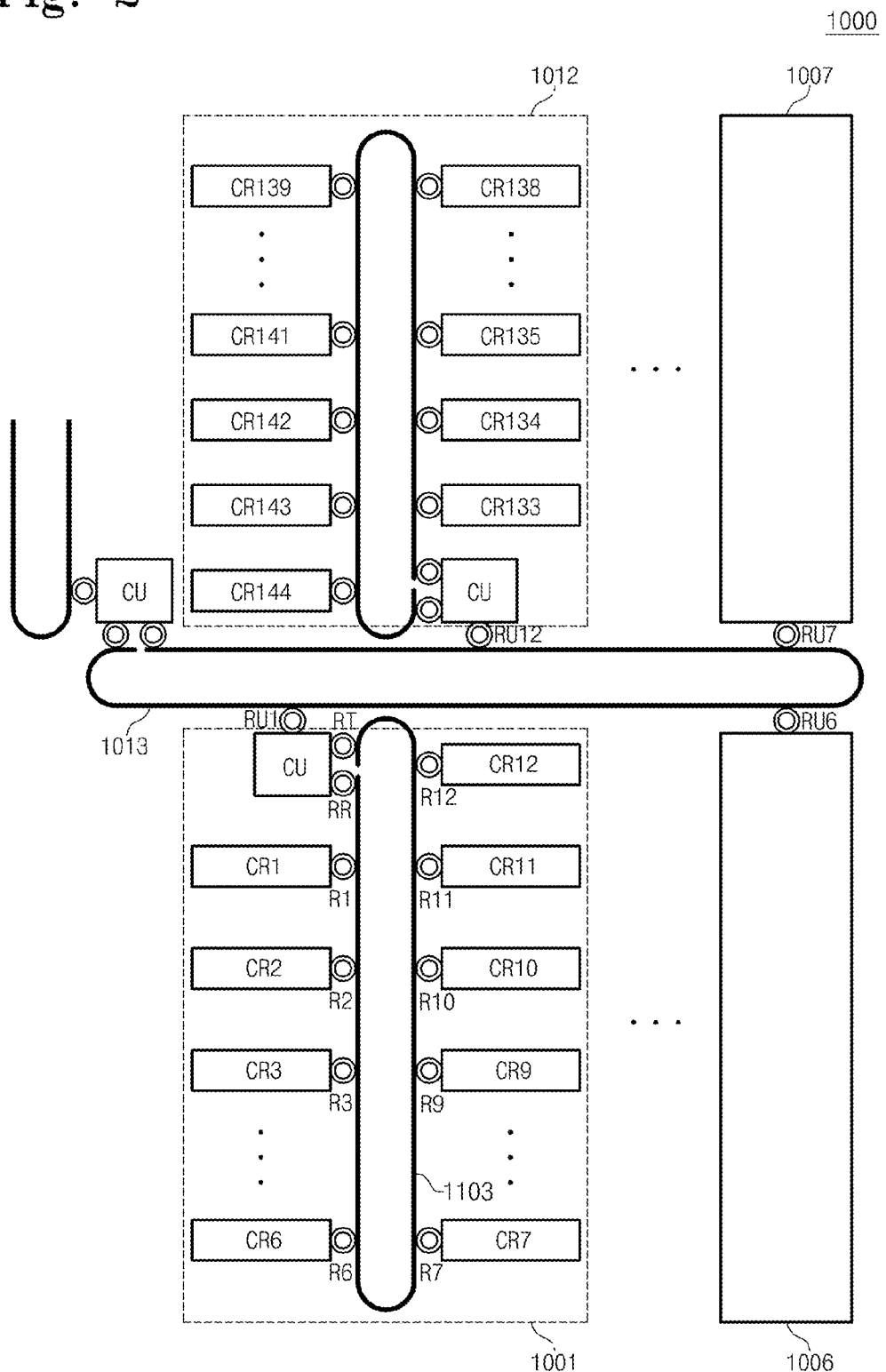
FIG. 2 is a diagram illustrating an optical network structure according to an embodiment of the present invention.

FIG. 2 is a diagram illustrating an optical network structure 1000 according to an embodiment of the present invention.

Referring to FIG. 2, in the optical network structure 1000, intersection between waveguides do not occur, and thus, two-way communication may be performed between all cores CR1 to CR144 even without an optical switch in an intersection point. For this, the optical network structure 1000 applies a ring type network structure for optical fiber optical communication and uses a plurality of 16-channel ring oscillator Wavelength Division Multiplexing (WDM) filters R1 to R16.

The optical network structure 1000 includes a plurality of network units 1001 to 1012. Each of the network units 1001 to 1012 includes twelve cores, a plurality of 16-channel ring oscillator WDM filters, and a control unit CU. Herein, twelve filters of the 16-channel ring oscillator WDM filters are used as a transmission/reception channel of each core, and other four filters are used as dummy channels.

In the embodiment of the present invention, a dummy channel may be multiply disposed by one per each core in preparation for a case where a defective channel occurs. In each network unit, the number and disposition of cores and the number and disposition of dummy channels may be variously changed depending on the case.

The optical network structure 1000 according to an embodiment of the present invention may include a next-upper optical network having the network units 1001 to 1012. When each network unit includes twelve cores, the next-upper optical network includes 144 cores. The optical network structure 1000 may include an upper optical network configured with twelve next-upper optical networks. When each next-upper network includes 144 cores, the upper optical network includes 1728 cores. When the upper optical network is configured in the above-described scheme, the optical network structure 1000 includes 12 to the nth power cores (where n is a natural number equal to or more than two).

In the embodiment of the present invention, the optical network structure 1000 may be implemented by disposing a CPU including a plurality of cores and a plurality of ring oscillator WDM filters in a monolithic structure.

Hereinafter, for convenience, the first network unit 1001 will be described as an example. The network unit 1001 includes twelve cores CR1 to CR12, a plurality of ring oscillator WDM filters R1 to R12 corresponding to the respective cores CR1 to CR12, and one control unit CU. Each of cores CR1 to CR12 may transmit/receive an optical signal to/from a ring type of next-upper waveguide 1013 through a corresponding ring oscillator WDM filter among the ring oscillator WDM filters R1 to R12.

The ring oscillator WDM filters R1 to R12 correspond to the cores CR1 to CR12, respectively. Each of the ring oscillator WDM filters R1 to R12 transmits an optical signal of a channel (or a wavelength), corresponding to the cores CR1 to CR12, to a waveguide 1103 or transmits the optical signal inputted to the waveguide 1103 to a core including the corresponding channel.

The control unit CU receives the optical signal transmitted to the waveguide 1103, modulates the channel of the received optical signal into a channel corresponding to a core for transmission, and transmits an optical signal of the modulated channel to the waveguide 1103. At this point, the control unit CU determines whether to transmit an optical signal, outputted from each core, to another core in the same network unit 1000 or a next-upper optical network.

When the received optical signal is transmitted to the other core in the network unit 1000, the control unit CU modulates a channel of the received optical signal into a channel corresponding to a core for transmission, and transmits an optical signal of the modulated channel to the waveguide 1103.

On the other hand, when the received optical signal is transmitted to a next-upper optical network, the control unit CU modulates a channel of the received optical signal into an upper channel corresponding to another network unit for transmitting the channel, and transmits an optical signal of the modulated upper channel to an upper waveguide 1013.

An upper control unit CU is included even in a next-upper optical network or an upper network, and performs the above-described function. The control unit CU converts an optical signal into an electric signal in an operation of receiving, determining, and transmitting the optical signal, and performs an optic-electro conversion operation of converting an electric signal into an optical signal once or twice.

As illustrated in FIG. 2, the number of control units CU in the network unit 1000 is one, but the present invention is not limited thereto. The network unit 1000 includes at least one control unit CU.

When the length of an optical signal is several cm or more, the optical signal may become longer than the circumference of a ring and overlap with another optical signal. To prevent this, the ring type waveguide 1103 in FIG. 2 is disconnected by passing through inside the control unit CU.

Figure 3:
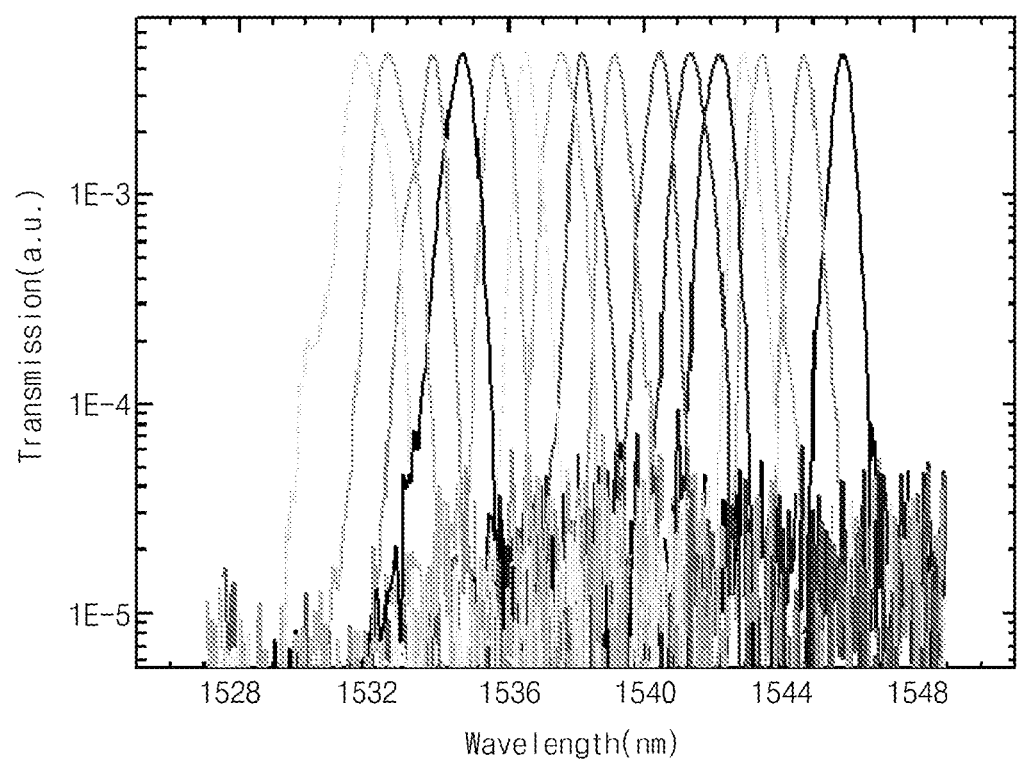
FIG. 3 is a diagram showing the characteristic of a 16-channel ring oscillator WDM filter of FIG. 2.

FIG. 3 is a diagram showing the characteristic of a 16-channel ring oscillator WDM filter of FIG. 2. In FIG. 3, it can be seen that 16 channels are clearly formed according to frequencies.

Figure 4:
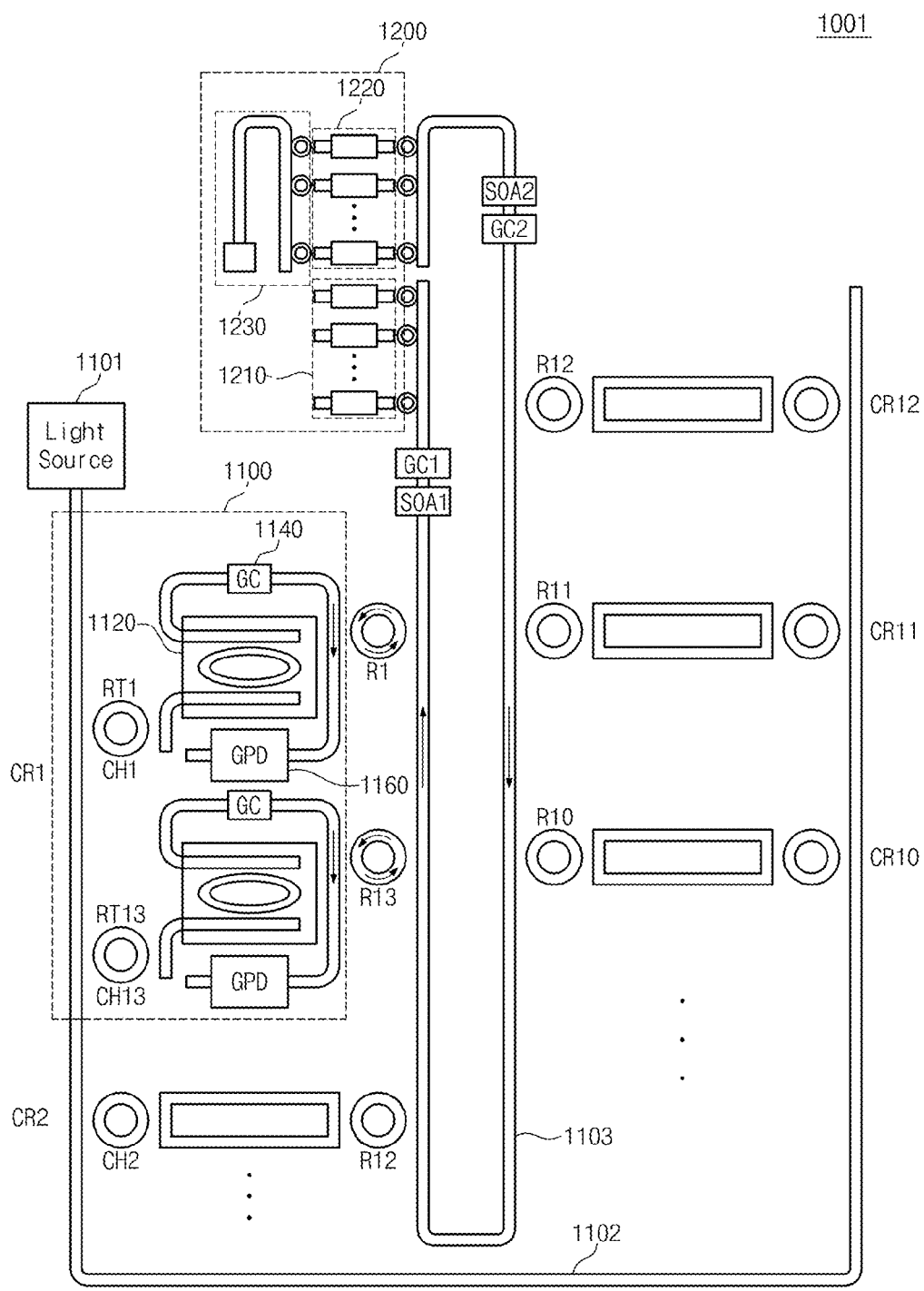
FIG. 4 is a diagram exemplarily illustrating an operation of transmitting an optical signal and the disposition of optical elements in a core.

FIG. 4 is a diagram exemplarily illustrating an operation of transmitting an optical signal and the disposition of optical elements in a core. For convenience, the first core CR1 will be described below as an example. The first core CR1 may transmit/receive an optical signal to the waveguide 1103 (hereinafter referred to as a bus line) through a transmission channel 1100. The transmission channel 1100 includes a first transmission channel CH1 that transmits an optical signal, outputted from the first core CR1, to the bus line 1103 or receives an optical signal from the bus line 1103 to transmit the received optical signal to the first core CR1, and a thirteenth transmission channel CH13. The first transmission channel CH1 transmits an optical signal with the first ring oscillator WDM filter R1, and the thirteenth transmission channel CH13 transmits an optical signal with the thirteenth ring oscillator WDM filter R13. Herein, the thirteenth transmission channel CH13 is a dummy channel.

Referring to FIG. 4, light emitted from a light source 1101 is irradiated on a waveguide 1102, and transmitted to an optical modulator 1120 through a ring oscillator WDM filter RT1. An optical signal having a specific level and order is generated by the optical modulator 1120, and transmitted to the bus line 1103 through the ring oscillator WDM filter R1.

In the embodiment of the present invention, the light source 1101 may use a semiconductor laser. The light source 1101 requires sixteen different wavelengths, and thus, sixteen lasers are required per unit group. Alternatively, the light source 1101 may use a Broadband Light Source (BLS, for example, SOA). In this case, the ring oscillator WDM filter RT1 determines a bandwidth of light that will be used by the first core CR1.

Depending on the case, amplifiers SOA1 and SOA2 and grating couplers GC1 and GC2 for monitoring may be disposed in the bus line 1103.

To check the state of an optical signal, a grating coupler 1140 outward extracting about 10% light may be disposed between the optical modulator 1120 and the ring oscillator WDM filter R1. Also, when a signal is weak, an amplifier (for example, SOA) may be disposed in front of a grating coupler GC.

In the embodiment of the present invention, the optical modulator 1120 is a ring oscillator type optical modulator, but the optical modulator 1120 according to an embodiment of the present invention is not limited thereto. As another example, the optical modulator 1120 may be a Mach-Zender optical modulator.

An optical signal transmitted to the bus line 1103 is transmitted to a receiver 1210 of the control unit 1200. An optical signal outputted from the control unit 1200 is transmitted to an optical detector 1160 of the first core CR1 through the bus line 1103 and the ring oscillator WDM filter R1.

In the embodiment of the present invention, the light source 1101, the optical modulator 1120 and the optical detector 1160 are coupled to waveguides 1102 and 1103 in a monolithic structure or a hybrid structure.

In the embodiment of the present invention, the optical detector 1160 may be implemented with a germanium photodiode GPD, but the optical detector 1160 according to an embodiment of the present invention is not limited thereto. As another example, the optical detector 1160 may be implemented as another compound optical detector.

Referring again to FIG. 4, the control unit 1200 includes a receiver 1210, a transmitter 1220, and an upper transmission channel 1230. A detailed description on the control unit 1200 will be made below with reference to FIG. 5.

Figure 5:
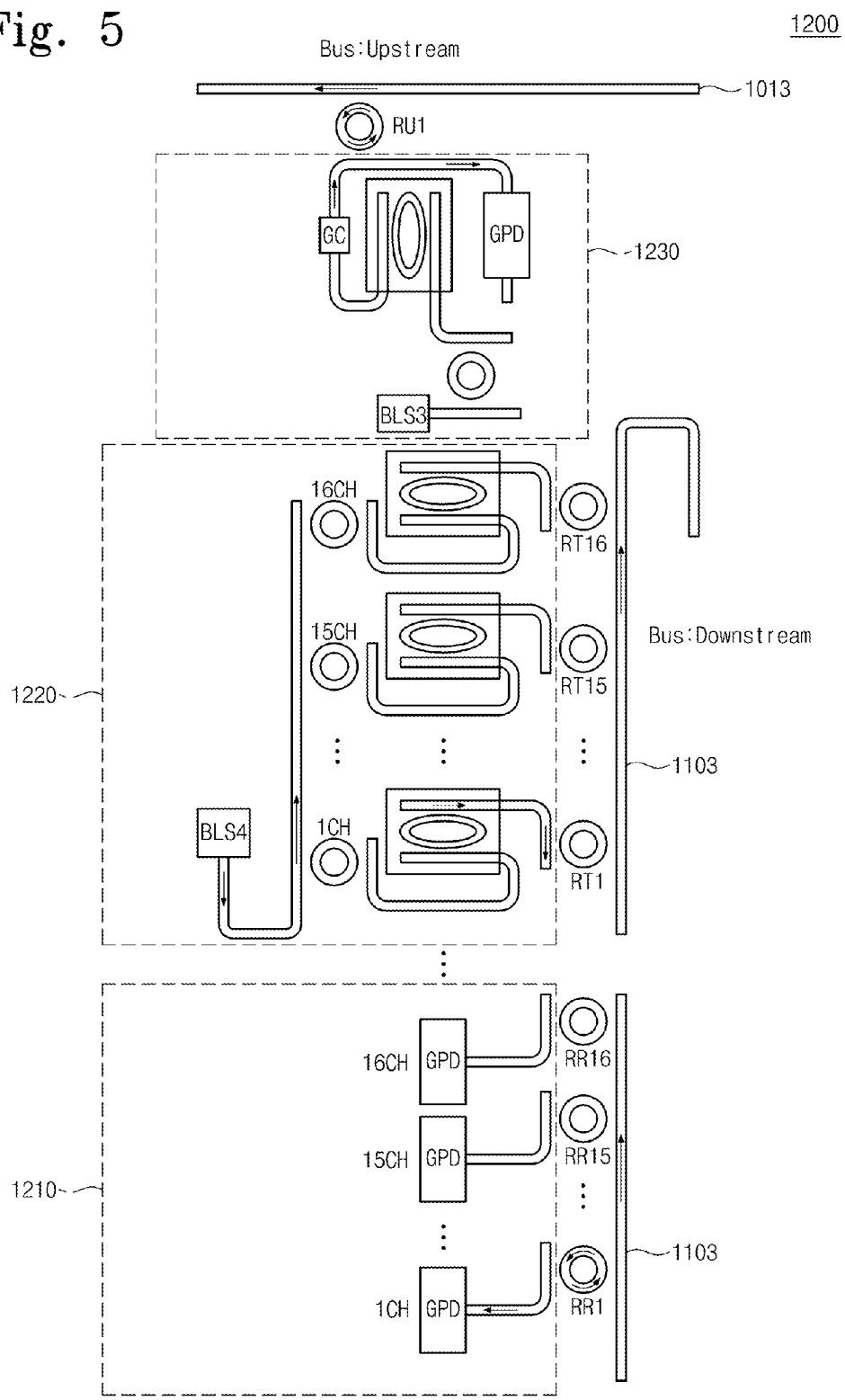
FIG. 5 is a diagram exemplarily illustrating a control unit according to an embodiment of the present invention.

FIG. 5 is a diagram exemplarily illustrating an operation of transmitting an optical signal and the disposition of optical elements in the control unit 1200 of FIG. 4.

Referring to FIG. 5, an optical signal transferred from each core through the bus line 1103 is transmitted to the optical detector GPD of the receiver 1210 through the 16-channel ring oscillator WDM filters.

The receiver 1210 includes sixteen optical detectors and 16-channel ring oscillator WDM filters for twelve channels and four dummy channels.

The transmitter 1220 is configured with sixteen transmission channels having the same structure as that of the transmission channel of each core. An operation of generating and transmitting an optical signal is the same as that of each core.

The bus line 1103 is disconnected between the receiver 1210 and the transmitter 1220.

The upper transmission channel 1230 includes the same transmission channel as the first core CR1 in order to transmit/receive an optical signal to/from an upper optical network, and is connected to an upper bus line 1013 through a ring oscillator WDM filter RU1.

Figure 6:
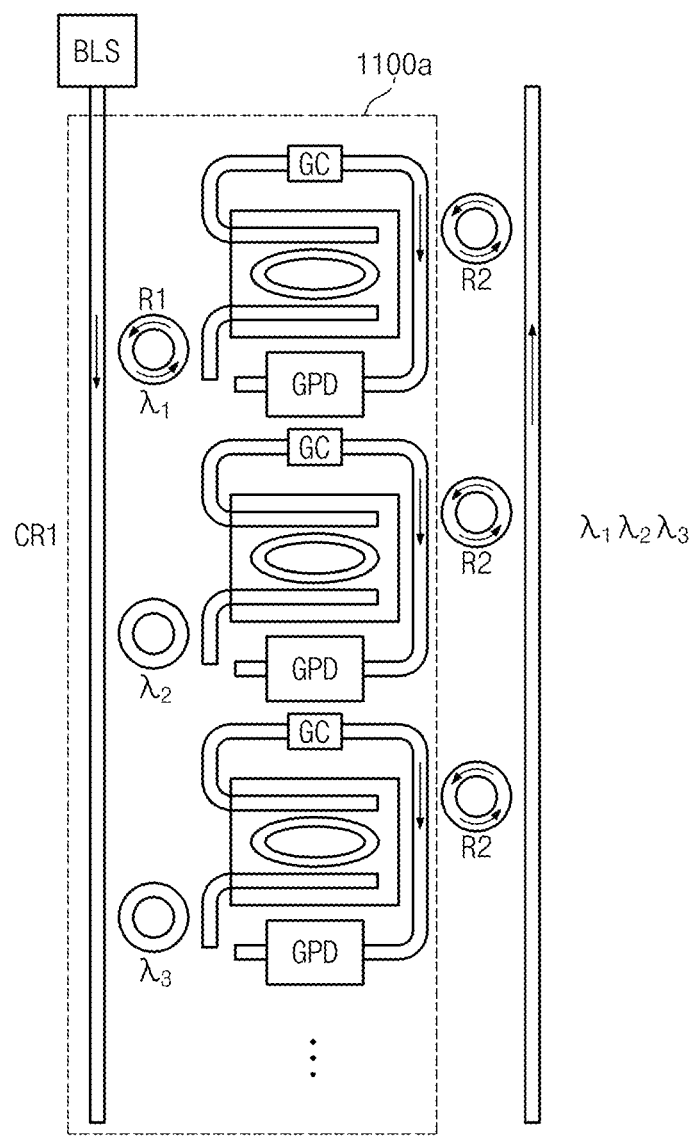
FIGS. 6 and 7 are diagrams exemplarily illustrating a multi-channel optical transceiver of each core.
Figure 7:
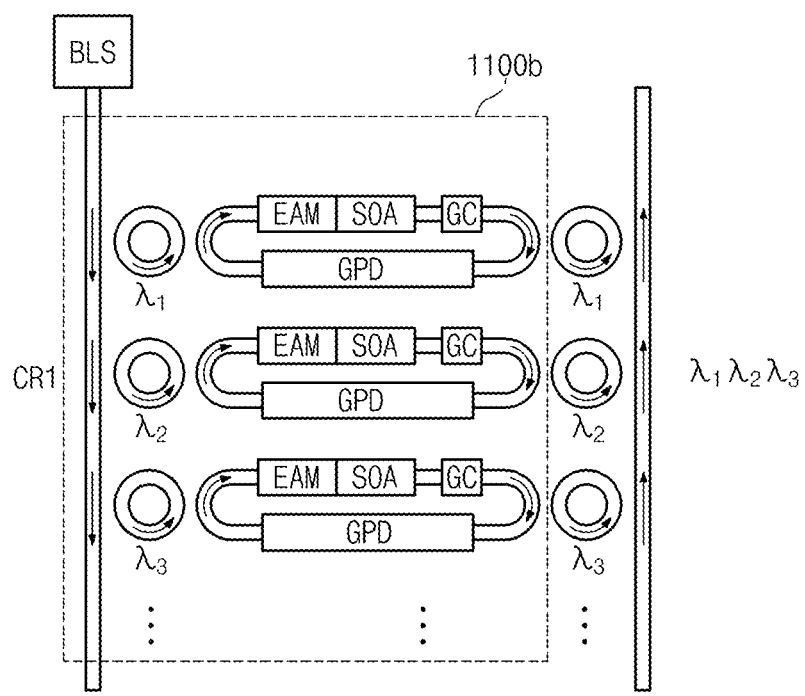

FIGS. 6 and 7 are diagrams exemplarily illustrating that the number of channels allocated to each core may be at least two. Fundamentally, each core necessarily requires one channel and one dummy channel, but when a communication speed increases to more than about 40 Gbps, a plurality of channels may be required. In this case, each core may operate a dummy channel and a plurality of channels such as two channels, four channels, etc., in a WDM scheme.

For example, if each core operates four channels, three channels is overlapped with another core in wavelength. In this case, the ring oscillator WDM filter R2 has a switching function of actively moving a resonance wavelength. However, a typical ring oscillator WDM filter cannot almost perform the switching function in characteristic. On the other hand, the present invention has the switching function.

In a current technical level, the optical interconnection rate of the ring oscillator WDM filter R2 is adjusted to about 20% (when four channels are operated). An overlapped wavelength channel is transmitted and received by a corresponding core, only a signal corresponding to each core is used, and other signals are ignored.

FIG. 7 exemplarily illustrates an example of using a device which is realized by integrating an electronic-absorption optical modulator EAM and SOA of a technically-advanced compound semiconductor as a single chip, instead of a ring oscillator optical modulator.

In order to configure an optical network for transmitting an optical signal between the cores of the CPU chip, the present invention prepares a CPU chip, including tens or more of cores, in a single silicon chip. Also, the present invention includes a process that manufactures 16-channel ring oscillator WDM filters, a waveguide, and an optical modulator in the same chip as a CPU, in a monolithic structure.

To form a silicon waveguide, a CPU, a waveguide and an optical element may be manufactured on an SOI wafer. To use a typical silicon wafer, technology that is currently and actively being researched and forms a silicon waveguide on a typical silicon wafer may be applied.

In a case of an optical element which cannot be manufactured in a silicon chip including a CPU in a monolithic structure, the present invention may include a process that mechanically adheres an optical element onto a silicon waveguide by applying a hybrid coupling technology.

Optical elements applying the hybrid coupling technology include a broadband light source of a compound semiconductor, a Semiconductor Optical Amplifier (SOA), a semiconductor laser, and a compound semiconductor optical detector (InGaAs photodiode).

Optical elements, which may be manufactured with a CPU in a monolithic structure, include a ring oscillator filter, a ring oscillator optical modulator, a Mach-Zender optical modulator, a germanium photodiode, and a grating coupler.

Moreover, the present invention includes a process that manufactures each optical element on a silicon wafer together with a CPU in a monolithic structure, or a process that collectively applies various technologies which are currently used to manufacture a unit element in hybrid coupling.

According to the embodiments of the present invention, a CPU chip that enables a single chip optical network using a silicon photonics optical element and is configured with hundreds or thousands of cores can be developed.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An optical network structure comprising:
   a waveguide having a ring type;
   a plurality of cores;
   a plurality of ring oscillator wavelength division multiplexing filters respectively corresponding to the cores, configured to transmit an optical signal of a channel corresponding to the cores to the waveguide, and to transmit the optical signal inputted to the waveguide to a core comprising a corresponding channel; and
   at least one control unit configured to receive the optical signal transmitted to the waveguide, to modulate a channel of the received optical signal into a channel corresponding to a core for transmission, and to transmit an optical signal of the modulated channel to the waveguide.

2. The optical network structure of claim 1, wherein the waveguide, the cores and the ring oscillator wavelength division multiplexing filters are implemented in a monolithic structure.

3. The optical network structure of claim 1, wherein,
   each of the cores comprises a transmission channel for using a corresponding ring oscillator wavelength division multiplexing filter, and
   at least one of the cores comprises a dummy channel.

4. The optical network structure of claim 3, wherein at least one transmission channel comprises:
   a first ring oscillator wavelength division multiplexing filter configured to receive an optical signal from a light source; and
   an optical modulator configured to modulate the optical signal, transmitted from the first ring oscillator wavelength division multiplexing filter.

5. The optical network structure of claim 4, wherein the light source is a broadband light source.

6. The optical network structure of claim 4, wherein the optical modulator has a ring oscillator type.

7. The optical network structure of claim 4, wherein the at least one transmission channel further comprises a grating coupler outward extracting a predetermined optical signal for checking an optical signal state between the optical modulator and the first ring oscillator wavelength division multiplexing filter.

8. The optical network structure of claim 7, wherein the at least one transmission channel further comprises an optical detector receiving the optical signal of the waveguide, outputted from the control unit, through the first ring oscillator wavelength division multiplexing filter.

9. The optical network structure of claim 3, wherein the waveguide comprises:
   at least one grating coupler configured to monitor an optical signal of the waveguide; and
   at least one amplifier configured to amplify the optical signal of the waveguide.

10. The optical network structure of claim 3, wherein,
    a number of transmission channels is twelve, and
    a number of dummy channels is four.

11. The optical network structure of claim 3, wherein the at least one control unit comprises:
    a receiver configured to receive the optical signal from the waveguide; and
    a transmitter configured to modulate the channel of the received optical signal into the channel corresponding to the core to be transmitted the received optical signal, and to transmit an optical signal of the modulated channel to the waveguide.

12. The optical network structure of claim 11, wherein the receiver comprises a plurality of optical detectors configured to receive optical signals of sixteen channels from the waveguide, respectively.

13. The optical network structure of claim 12, wherein the transmitter comprises a plurality of transmission channels outputting an optical signal, inputted from a light source, to the waveguide by using a ring oscillator wavelength division multiplexing filter.

14. The optical network structure of claim 12, wherein the waveguide is disconnected between the receiver and the transmitter.

15. The optical network structure of claim 1, wherein each of the cores comprises at least three transmission channels.

16. The optical network structure of claim 15, wherein each of the transmission channels modulates an optical signal using one device which is implemented by integrating an electronic-absorption optical modulator and a semiconductor optical amplifier in a monolithic structure.

17. The optical network structure of claim 16, wherein,
an optical interconnection rate of the ring oscillator wavelength division multiplexing filters is about 20%,
an optical signal of an overlapped wavelength channel is transmitted and received by a corresponding each core, and
an optical signal corresponding to the each core is used, and other optical signals are ignored.

18. An optical network structure comprising:
an upper waveguide having a ring type;
a plurality of network units;
a plurality of upper ring oscillator wavelength division multiplexing filters respectively corresponding to the network units, configured to transmit an optical signal of an upper channel corresponding to the network units to the upper waveguide, and to transmit the optical signal inputted to the upper waveguide to a network unit comprising a corresponding upper channel; and
a control unit configured to receive the optical signal transmitted to the upper waveguide, to modulate an upper channel of the received optical signal into an upper channel corresponding to a network unit for transmission, and to transmit an optical signal of the modulated upper channel to the upper waveguide,
wherein each of the network units comprises:
a waveguide having a ring type;
a plurality of cores;
a plurality of ring oscillator wavelength division multiplexing filters respectively corresponding to the cores, configured to transmit an optical signal of a channel corresponding to the cores to the waveguide, and to transmit the optical signal inputted to the waveguide to a core comprising a corresponding channel; and
a control unit configured to receive the optical signal transmitted to the waveguide, to modulate a channel of the received optical signal into a channel corresponding to a core for transmission, and to transmit an optical signal of the modulated channel to the waveguide.

19. The optical network structure of claim 18, wherein a next-upper network is configured with some of the network units.

20. The optical network structure of claim 19, wherein an upper network is configured with a predetermined number of next-upper networks.

* * * * *